United States Patent
Bergamashi/Rab et al.

(10) Patent No.: US 6,477,691 B1
(45) Date of Patent: Nov. 5, 2002

(54) METHODS AND ARRANGEMENTS FOR AUTOMATIC SYNTHESIS OF SYSTEMS-ON-CHIP

(75) Inventors: Reinaldo A. Bergamashi/Rab, Tarrytown; Subhrajit Bhattacharya, White Plains, both of NY (US); Jean-Marc R. Daveau, Grenoble (FR); William R. Lee, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/542,025

(22) Filed: Apr. 3, 2000

(51) Int. Cl.[7] ................................. G06F 17/50
(52) U.S. Cl. ................. 716/12; 716/1; 716/10
(58) Field of Search ............... 716/12, 1, 8–11, 716/13–14

(56) References Cited

U.S. PATENT DOCUMENTS 5,870,310 A * 2/1999 Malladi ................. 716/19
6,338,158 B1 * 1/2002 Payne .................... 703/14

OTHER PUBLICATIONS

"VSI Alliance Architecture Document", Version 1.0, VSI Alliance, 1997.
A.M. Rincon et al., "The Changing Landscape of System–on–a–chip Design", IBM MicroNews, vol. 5, No. 3, pp. 1–9, IBM Microelectrics, 3rd Quarter, 1999.
"The CoreConnect Bus Architecture", IBM Corporation, pp. 1–8, 1999.
A.M. Rincon et al., "Core Design and System–on–a–Chip Integration", IEEE Design & Test of Computers, pp. 26–35, Oct./Dec/. 1997.
P. Schindler et al., "IP Repository, A Web based IP Reuse Infrastructure", IEEE Custom Intergrated Circuits Conference, pp. 415–418, May, 1999.
R.E. Bryant, "Graph–Based Algorithms for Boolean Function Manipulation", IEEE Transactions on Computers, vol. C–35, No. 8, Aug. 1986, pp. 677–691.
W.P. Birmingham et al., "MICON: Automated Design of Computer Systems", Engineering Design Research Center, Carnegie Mellon University, Pittsburgh, PA.

* cited by examiner

Primary Examiner—Matthew Smith
Assistant Examiner—Brandon Bowers
(74) Attorney, Agent, or Firm—Ference & Associates

(57) ABSTRACT

Processes and arrangements for describing a system-on-chip at an abstract level. Contemplated is the creation of a "virtual design" and its automatic synthesis into a "real design that includes IP blocks from a library as well as all required interconnections and interface logic between them. Significant reductions in the complexity, time and cost associated with system-on-chip designs can be enjoyed as a result.

13 Claims, 8 Drawing Sheets

```
ENTITY PPC_VC IS
PORT ( PLB_M_ICU_interface:        in STD_LOGIC;
       PLB_M_DCU_interface:        in STD_LOGIC;
       ISOCM_interface:            in STD_LOGIC;
       DSOCM_interface:            in STD_LOGIC;
       APU_interface:              in STD_LOGIC;
       RESET_interface:            in STD_LOGIC;
       INTERRUPT_interface:        in STD_LOGIC;
       CLOCK_interface:            in STD_LOGIC;
       DCR_interface:              in STD_LOGIC;
       ITAG_interface:             in STD_LOGIC

```
-Typical System-on-Chip
LIBRARY IEEE; USE IEEE.std_logic_1164.all;
LIBRARY WORK; USE WORK.virtual_components.all;

ENTITY Virtual_Design_Example IS
Port (
    -- BIU Interface
    BIU_EXT         : in STD_LOGIC;
    --DMA Interface
    DMA_EXT         : in STD_LOGIC;
    --SPU Interface
    SPU_EXT         : in STD_LOGIC;
    --CPU Inerrupt Interface
    CPU_EIC_EXT     : in STD_LOGIC;
    --APU Interface
    APU_EXT         : in STD_LOGIC;
    --Miscellanous Interaces
    RESET_EXT       : in STD_LOGIC;
    CLOCK_EXT       : in STD_LOGIC
    );
END Virtual_Design_Example:

ARCHITECTURE virtual OF Virtual_Design_Example IS
    Signal plb_Sl_s                              : STD_LOGIC;
    Signal ppc_icu_plb_s, ppc_dcu_plb_s          : STD_LOGIC;
    Signal brg_plb_M_s, brg_opb_s                : STD_LOGIC;
    Signal dma_plb_M_s,int_dma_s                 : STD_LOGIC;
    Signal isocm_s, dsoem_s                      : STD_LOGIC;
    Signal apu_s, spu_obp_s                      : STD_LOGIC;
    Signal reset_s, clock_s                      : STD_LOGIC;

BEGIN

CPU: PPC_VC
PORT MAP ( plb_M_ICU_interface  => ppc_icu_plb_s,
           plb_M_DCU_interface  => ppc_dcu_plb_s,
           isocm_interface      => isocm_s,
           dsocm_interface      => dsocm_s,
           apu_interface        => apu_s,
           interrupt_interface  => CPU_EIC_EXT,
           reset_interface      => reset_s,
           clock_interface      => clock_s,
           );

PLB:PLB_BUS_VC
PORT MAP (opb_MO_interface  => ppc_icu_plb_s,
          plb_M1_interface  => ppc_dcu_plb_s,
          plb_M2_interface  => dma_plb_M_s,
          plb_S1_interface  => plb_S1_s,
          reset_interface   => reset_s,
          clock_interface   => clock_s,
          );

OPB : OPB_BUS_VC
PORT MAP ( opb_MO_interface => brg_opb_s,
           opb_S1_interface => spu_opb_s,
           reset_interface  => reset_s,
           clock_interface  => clock_s
           );

BRG: BRG_OPB_PLB_VC
PORT MAP (plb_S1_interface   => plb_S1_s
          opb_M_interface    => brg_opb_s,
          dma_interface      => int_dma_s,
          reset_interface    => reset_s,
          clock_interface    => clock_s
          );

DMA : DMA_PLB_VC
PORT MAP ( plb_M_interface    => dma_plb_M_s,
           plb_S1_interface   => plb_S1_s,
           plb_dma_interface  => int_dma_s,
           ext_dma_interface  => DMA_EXT,
           reset_interface    => reset_s,
           clock_interface    => clock_s
           );

BIU : BIU_VC
PORT MAP (plb_S1_interface    => plb_S1_s,
          dma_interface       => int_dma_s,
          ext_interface       => BIU_EXT,
          reset_interface     => reset_s,
          clock_interface     => clock_s
          );

OCM: OCM_VC
PORT MAP ( isocm_interface    => isocm_s,
           dsocm_interface    => dscom_s,
           reset_interface    => reset_s,
           clock_interface    => clock_s
           );

APU: APU_VC
PORT MAP ( apu_interface      => apu_s,
           ext_interface      => APU_EXT,
           reset_interface    => reset_s,
           clock_interface    => clock_s
           );

SPU: SPU_VC
PORT MAP (opb_S1_interface    => spu_opb_s,
          dma_interface       => int_dma_s,
          ext_interface       => SPU_EXT,
          reset_interface     => reset_s,
          clock_interface     => clock_s
          );

RST: RESET_VC
PORT MAP ( ext_reset_interface => RESET_EXT,
           reset_interface     => reset_s,
           clock_interface     => clock_s
           );

CLK: CLKG_VC
PORT MAP ( ext_clock_interface => CLOCK_EXT,
           clock_interface     => clock_s,
           reset_interface     => reset_s
           );
END virtual;
```

FIG. 3

VIRTUAL DESIGN
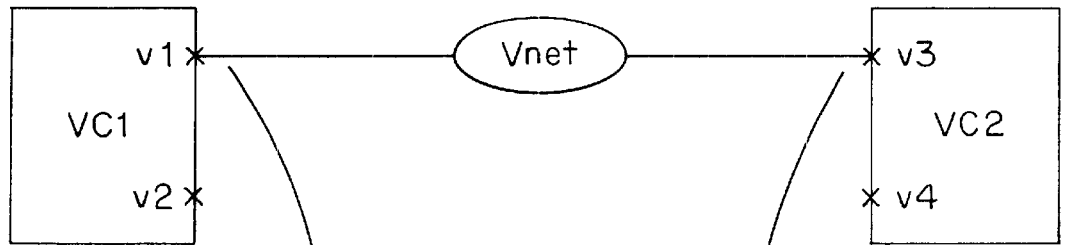
Step 1: Find compatible real pins
REAL DESIGN
Step 2: Compare properties of {r1, r2, r3} with {r6, r7, r8} Assuming that {r1, r7}, {r2, r8} and {r3, r6} are compatible. The VRSE will produce the connections shown below.
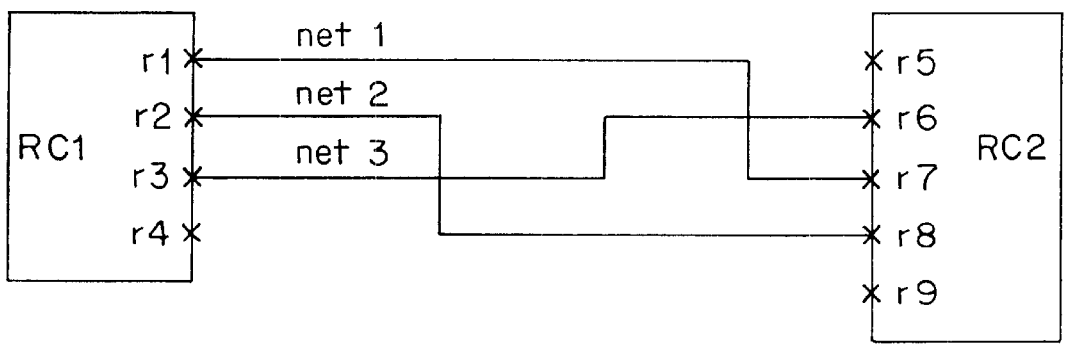
FIG. 5

VIRTUAL DESIGN

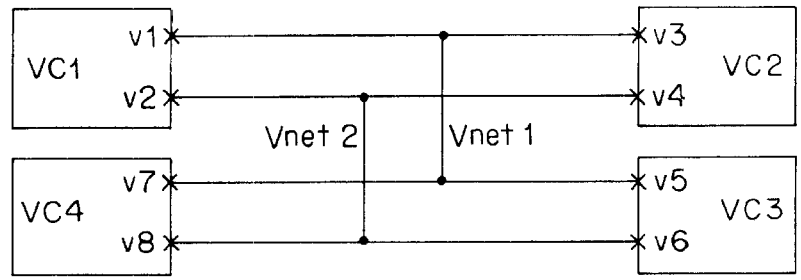

REAL DESIGN

Virtual to Real Interface mappings:
  Virtual pin v1   maps to   real pin r1 (0:0),    output
                             real pin r2 (0:15),   input,   CONNECTION_LOGIC=CONCAT
  Virtual pin v2   maps to   real pin r3 (0:15),   output
                             real pin r4 (0:0),    output,  PRIORITY = 2
  Virtual pin v3   maps to   real pin r5 (0:0),    input,   CONNECTION_LOGIC = XOR
                             real pin r6 (0:3),    output
  Virtual pin v4   maps to   real pin r7 (0:7),    input
                             real pin r8 (0:0),    output,  PRIORITY = 1
  Virtual pin v5   maps to   real pin r9 (5:11),   output
                             real pin r10 (0:0),   output
  Virtual pin v6   maps to   real pin r11 (0:3),   input,   CONNECTION_LOGIC=CONCAT
  Virtual pin v7   maps to   real pin r12 (4:0),   output
                             real pin r13 (0:0),   output
  Virtual pin v8   maps to   real pin r14 (0:0),   output   PRIORITY = 0

Compatible sets:
  {r1, r5, r10, r13}; {r2, r6, r9, r12}; {r3, r7}; {r4, r8, r11, r14}

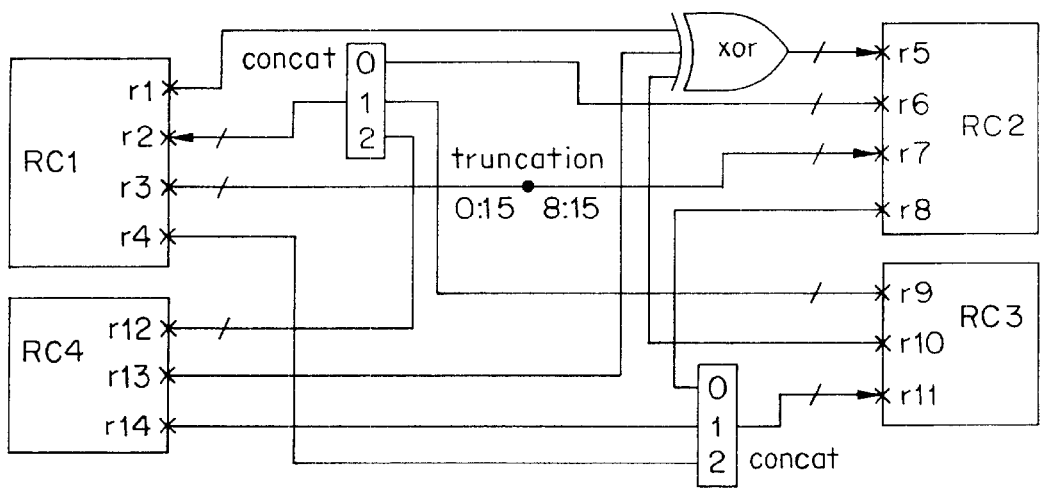

FIG. 7

METHODS AND ARRANGEMENTS FOR AUTOMATIC SYNTHESIS OF SYSTEMS-ON-CHIP

FIELD OF THE INVENTION

The present invention generally relates to the design and fabrication of systems-on-chip (SoC) and to methods and arrangements associated with the same.

BACKGROUND OF THE INVENTION

Generally, systems-on-chip (SoC) are increasingly relying on reuse of pre-designed and pre-verified intellectual property (IP) blocks. However, in order to build a system-on-chip the designer has to manually instantiate these IP blocks and create all the necessary interconnections between them. This is a time-consuming and error-prone process More particularly, with the continuing increases in silicon density and associated rise in design complexity, more design projects are relying on methods of core reuse to complete their very large scale integration (VLSI) chips within alotted time frames. These ever-increasing silicon densities have now made it affordable to integrate the majority of the system on a single VLSI device.

The integration of the central processor unit (CPU), memory and peripherals within a single VLSI device adds system complexities to what used to be a standard application-specific intergrated circuit (ASIC) development. The typical ASIC designer developing a SoC often does not have resources available to deal with the inherent system complexities as wells as the complexities of the cores themselves, and to maintain the schedule of a standard ASIC development.

The use of pre-designed and pre-verified IP blocks (henceforth referred to as cores) has helped reduce expenditures of time and cost related to large SoCs. However, the lack of appropriate tools and the increasing complexity of such cores make them inherently difficult to use. The process of integrating several cores in an SoC is currently a manual and error-prone process which requires the designer to understand the details of the cores and how they should be interconnected. Currently, SoC integration involves the use of pre-designed cores in a very low-level manner, that is, cores are used in the same way as other low- level components, even though they usually represent much larger functions. Currently, there is no high- level abstraction that allows cores to be used easily and without the need for an expert designer.

In A. Rincon, W. Lee and M. Slatery, "The Changing Landscape of System-on-a-Chip Design" (IBM MicroNews, 3rd Quarter 1999, Vol.5, No.3, IBM Microelectronics) and A. Rincon, C. Cherichetti, J. Monzel, D. Stauffer and M. Trick, "Core Design and System-on-a-Chip Integration" (IEEE Design & Test of Computers, October/December 1997), complex system-on-chip examples are discussed which illustrate the high complexity of current cores and the difficulties in integrating them into a single VLSI chip.

In traditional ASIC design flows, there is a high-level of abstraction represented by the register-transfer level (RTL) language description, using hardware description languages such as VHDL or Verilog. In this context, the design is written at a high-level and it is mapped to a low-level (gate-level netlist) by logic synthesis tools. In current SoC design flows, there is no similar high-level of abstraction. SoC designs are described directly at the core level (similar to gate-level) by manually instantiating the cores and the interconnections among their pins. In other words, core-based SoC design today is at a similar stage that ASIC design was prior to the widespread use of hardware description languages and logic synthesis tools.

Essentially, the only high-level description of an SoC in the context of conventional arrangements is the initial design document which is text-based and used for documentation purposes only, and thus is not synthesizable. Since there are apparently no higher-levels of abstraction for core-based SoC design that are automatically synthesizable, the capabilty of reusing pre-designed IP blocks is severely limited, thus constituting a major drawback to reducing expenditures of time and cost in connection with SoC designs.

In view of the foregoing, a need has been recognized in connection with providing high-level abstraction that allows a system-on-chip to be designed at a very high-level and automatically synthesized down to real cores and interconnections.

SUMMARY OF THE INVENTION

In accordance with at least one presently preferred embodiment of the present invention, a methodology and algorithms for SoC design are contemplated in which cores are used based on the concept of a synthesizable "virtual design". As a result, the level of abstraction and productivity for SoC integration is raised by enabling the designer to work at the virtual component level.

Preferably, the SoC is designed at the virtual level as a grouping of virtual components. Various methods and algorithms contemplated herein thence automatically synthesize a "real design" from the initial virtual design. (The term "real design", as employed herein, refers to the complete and final top-level netlist of the SoC with all the necessary cores and interconnections.) Two broad aspects are particularly contemplated herein, namely, a "virtual design" and a "virtual-to-real synthesis engine".

In one aspect, the present invention provides a method of predetermining interconnections between at least two cores in a system-on-chip, the method comprising: establishing a virtual design for the system-on-chip, the virtual design including at least two virtual components, at least one virtual pin associated with each virtual component, and at least one virtual interconnection between at least one pair of virtual pins; and automatically transforming the virtual design into a real design, the real design including at least two real components, at least one real pin associated with each real component and at least one real interconnection between at least one pair of real pins; wherein the transforming step comprises determining the at least one real interconnection based on the compatibility between different real pins.

In another aspect, the present invention provides a system for predetermining interconnections between at least two cores in a system-on-chip, the system comprising: a virtual design system which establishes a virtual design for the system-on-chip, the virtual design including at least two virtual components, at least one virtual pin associated with each virtual component, and at least one virtual interconnection between at least one pair of virtual pins; and a transforming system which automatically transforms the virtual design into a real design, the real design including at least two real components, at least one real pin associated with each real component and at least one real interconnection between at least one pair of real pins; wherein the transforming system is adapted to determine the at least one real interconnection based on the compatibility between different real pins.

Furthermore, the present invention provides a program storage device readable by machine, tangibly embodying a program of instructions executable by the machine to perform method steps for predetermining interconnections between at least two cores in a system-on-chip, the method comprising the steps of: establishing a virtual design for the system-on-chip, the virtual design including at least two virtual components, at least one virtual pin associated with each virtual component, and at least one virtual interconnection between at least one pair of virtual pins; and automatically transforming the virtual design into a real design, the real design including at least two real components, at least one real pin associated with each real component and at least one real interconnection between at least one pair of real pins; wherein the transforming step comprises determining the at least one real interconnection based on the compatibility between different real pins.

For a better understanding of the present invention, together with other and further features and advantages thereof, reference is made to the following description, taken in conjunction with the accompanying drawings, and the scope of the invention will be pointed out in the appended claims.

DESCRIPTION OF THE DRAWINGS

FIG. 2 depicts a virtual component interface definition;

FIG. 3 depicts a virtual design for a typical embedded system-on-chip;

FIG. 5 is a schematic illustration of various steps during virtual to real synthesis;

FIG. 7 is a schematic depiction of virtual to real synthesis with interface logic insertion.

DESCRIPTION OF THE PREFERRED EMBODIMENTS

Figure 1:
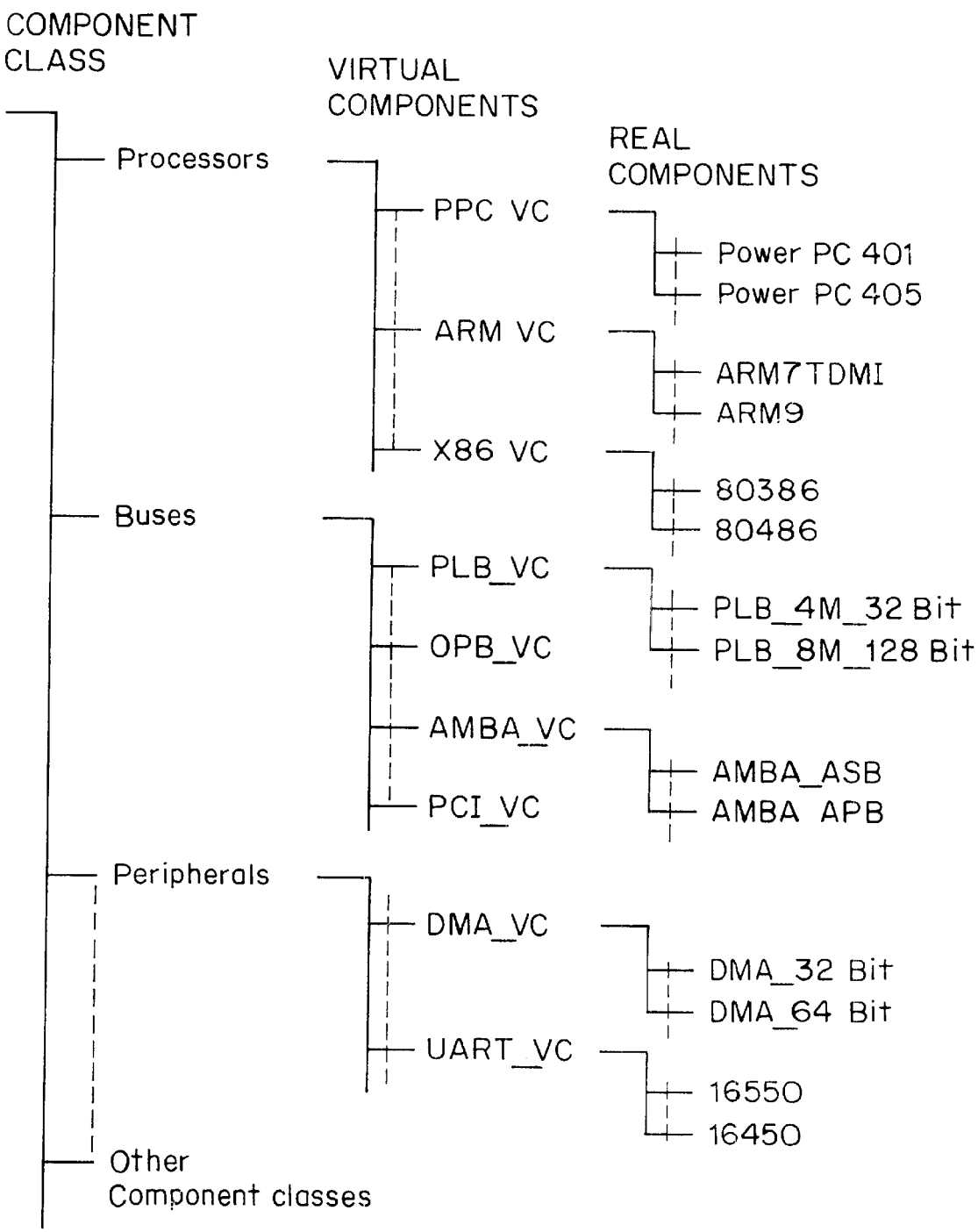
FIG. 1 depicts a fragment of a virtual component library.

One aspect of the present invention, in accordance with at least one presently preferred embodiment, involves a "virtual design", as described herebelow.

In most ASIC and SoC design methodologies one of the first tasks is the writing of the system specification. This textual specification is used for documentation purposes only. It is common for it to include a high-level schematic drawing of the system, showing the main components of the system and the main interconnections. This document is then used as a reference by the designers during the actual design phase. It is important to note that this specification document is "for documentation purposes only" and it cannot be automatically synthesized. This divide between specification and implementation can lead to implementation errors and extra cost and time-to-market. As will be appreciated from the discussion below, the method and algorithms contemplated in accordance with the present invention are believed to solve this very problem. Below, the concept of a "virtual design" is defined, which is a synthesizable specification of the design at a very high-level of abstraction.

Preferably, the virtual design is a structural and functional encapsulation of the real design and includes virtual components, virtual interfaces and virtual nets. The "virtual-to-real synthesis engine" (VRSE), described further below, preferably performs the mapping of a virtual design into a real design. The VRSE preferably includes cores from a library, interconnections and glue logic (if necessary). As a structural encapsulation, the virtual design can be generated using directly a schematic editor or any hardware-description language (e.g., VHDL, Verilog). It should be noted that a distinction is made here between a "virtual component" as defined herein and the term Virtual Component™ as trade-marked by the Virtual Socket Initiative (VSI) (VSI Alliance™ Architecture Document, Version 1.0, VSI Alliance, 1997, http://www.vsi.com/the_rest.html). In the VSI Alliance definition, a "Virtual Component" refers to an actual component, core or IP block which was designed to meet the VSI specification and to be used in the "Virtual Socket" design environment. In the present disclosure, a virtual component (VC) is, as the name indicates, a virtual representation of the actual (or real) component, but not the actual component itself.

A virtual component is preferably a representation of a class of real components. For example, the PowerPC virtual component (PPC_VC) represents all real PowerPC cores (e.g., 401, 405). For the same virtual design, the user can at any moment select a different real component mapping for a virtual component and the VRSE will automatically regenerate the necessary interconnections and glue logic to use the new real component. The term "glue logic" typically refers to a number of logic gates that need to be inserted in between components or cores for them to be properly interconnected.

The inputs/outputs of a virtual component are referred to as virtual interfaces. Virtual interfaces are connected using virtual nets. A virtual interface represents a grouping of the real interface pins which are functionally related. For example, the virtual component contains a single virtual pin PLB_M_ICU_INTERFACE representing all real pins (in the real PowerPC cores) which are responsible for the interface between the internal instruction cache unit and the master side of the external processor bus.

Because the number of virtual ports ranges between 4 to 15 for a virtual component vs. 50 to 300 for a real component, the task of creating a virtual design is much simplified and roughly equivalent to drawing the system block diagram for the SoC. The virtual design represents both a synthesizable description of the SoC as well as the documentation describing the function of the SoC. This effectively bridges the gap between a synthesizable specification and documentation and ensures that both (which are in fact one) remain consistent with each other.

Virtual components are preferably organized in one or more virtual component libraries. A virtual component library is a tree structure which contains as root nodes the major classes of components, e.g., Processors, Buses. The intermediate nodes are the virtual components themselves, e.g., PPC_VC, PCI_VC; and the leaf nodes are the names of the available real components for each virtual component.

FIG. 1 shows a fragment of a virtual component library. For each major component class (e.g., Processors, Buses) there are preferably several virtual components representing the class functions (e.g., PPC_VC, ARM_VC, PLB_VC). For each virtual component there are preferably several corresponding real components which can implement the virtual function (e.g., PowerPC401, PowerPC405).

Preferably, a virtual design is created in the following steps:

1. Select all virtual components needed in the design from the virtual components library. This can be done using a schematic editor, or a text editor if using an HDL, or by loading a template design.
2. Annotate each virtual component with the chosen real component to be used.

This specifies an initial mapping which can be changed later. A default mapping can also be used to bypass this step.
3. Create virtual nets connecting the virtual interfaces. This can also be done using a schematic editor or directly in the HDL description.
4. Configure the system by specifying properties such as interrupt priorities, address maps, etc.

From the virtual design the designer can automatically generate the real design by running the virtual-to-real synthesis step (described further below). Each virtual component gets mapped to the chosen real component in the real design, with any associated glue logic. Each virtual interface gets expanded into the real interface pins which are connected by nets. Each virtual net gets expanded into real nets connecting real interface pins.

In order to illustrate the degree of encapsulation of a virtual component, one may consider the PowerPC virtual component (PPC_VC) and the real PowerPC 401 (PowerPC401). The VHDL component declaration for PPC_VC, shown in FIG. 2, has 10 pins, or virtual interfaces, whereas the real component PPC401 has around 160 pins. The 10 virtual pins describe functional interfaces such as PLB_M_ICU_interface (master instruction cache unit bus interface), or INTERRUPT_interface, or APU_interface (Auxiliary processor unit interface), as well as other required interfaces for clocking and testing. Each virtual interface may correspond to several real pins. For example the PLB_M_ICU_interface virtual pin corresponds to 12 real pins (including inputs and outputs). FIG. 3 shows a complete virtual design for a typical programmable embedded system. This system is based on a PowerPC™ processor and the buses defined in the CoreConnect™ bus architecture (as set forth in "The CoreConnect™ Bus Architecture" IBM, 1999, http://www.chips.ibm.com/product/coreconnect/docs/crcon_wp.pdf), namely the Processor Local Bus (PLB) and the On-Chip Peripheral Bus (OPB). Although the virtual design is based on a fixed architecture (PowerPC+CoreConnect), its components are at the virtual level, that is, they can be synthesized using any available real component. Furthermore, the basic architecture can also be changed easily at this level by replacing the architecture specific virtual components by others with similar function (for example, replacing the PPC_VC with ARM_VC if the ARM architecture is desired).

The virtual elements used in FIG. 3 are:
1. PPC_VC: Power PC virtual component
2. PLB_BUS_VC: Processor Local Bus (PLB) virtual component
3. OPB_BUS_VC: On-Chip Peripheral Bus (OPB) virtual component
4. BRG_OPB_PLB_VC: OPB-to-PLB Bridge virtual component
5. DMA_PLB_VC: DMA Controller virtual component, for transferring data over the PLB bus
6. BIU_VC: Bus Interface Unit virtual component containing external interfaces for PLB and DMA signals
7. OCM_VC: On-Chip Memory virtual component which has separate interfaces for instruction and data, and is connected directly to the processor virtual component
8. APU_VC: Auxiliary Processor Unit virtual component which is an accelerator unit for certain processor-related tasks
9. SPU_VC: Serial Port Unit virtual component
10. RESET_VC: Reset controller virtual component
11. CLOCK_VC: Clock generator virtual component
12. VIRTUAL PORTS: There are several external interfaces which communicate with the environment. These ports are declared as "IN" for syntactical reasons only.

Each virtual port may get expanded by the VRSE into several real ports of different directions (e.g., IN, OUT, INOUT). Since it is impossible for the virtual ports to be declared in all three directions at the same time, it was adopted the convention that the virtual ports would be declared as IN. Virtual ports represent all interfaces of a virtual component including functional as well as test interfaces (e.g., JTAG interface). For clarity reasons, all test interfaces were omitted in FIG. 3.
13. VIRTUAL NETS: These virtual nets are declared as signals (if using VHDL) and connected to the virtual ports. For example, the virtual net represented by the signal plb_Sl_s is connected to the virtual slave interface on the PLB_VC virtual (port plb_Sl_interface), as well as to the PLB slave virtual components (BIU_VC, DMA_VC and BRG_OPB_PLB_VC). This virtual connection gets expanded into several real interfaces and real nets for all the signals required for connecting a slave device to the PLB bus.

The disclosure now turns to another aspect of the present invention, in accordance with at least one presently preferred embodiment, involving a "virtual-to-real synthesis engine" (VRSE), as described herebelow.

Figure 4:
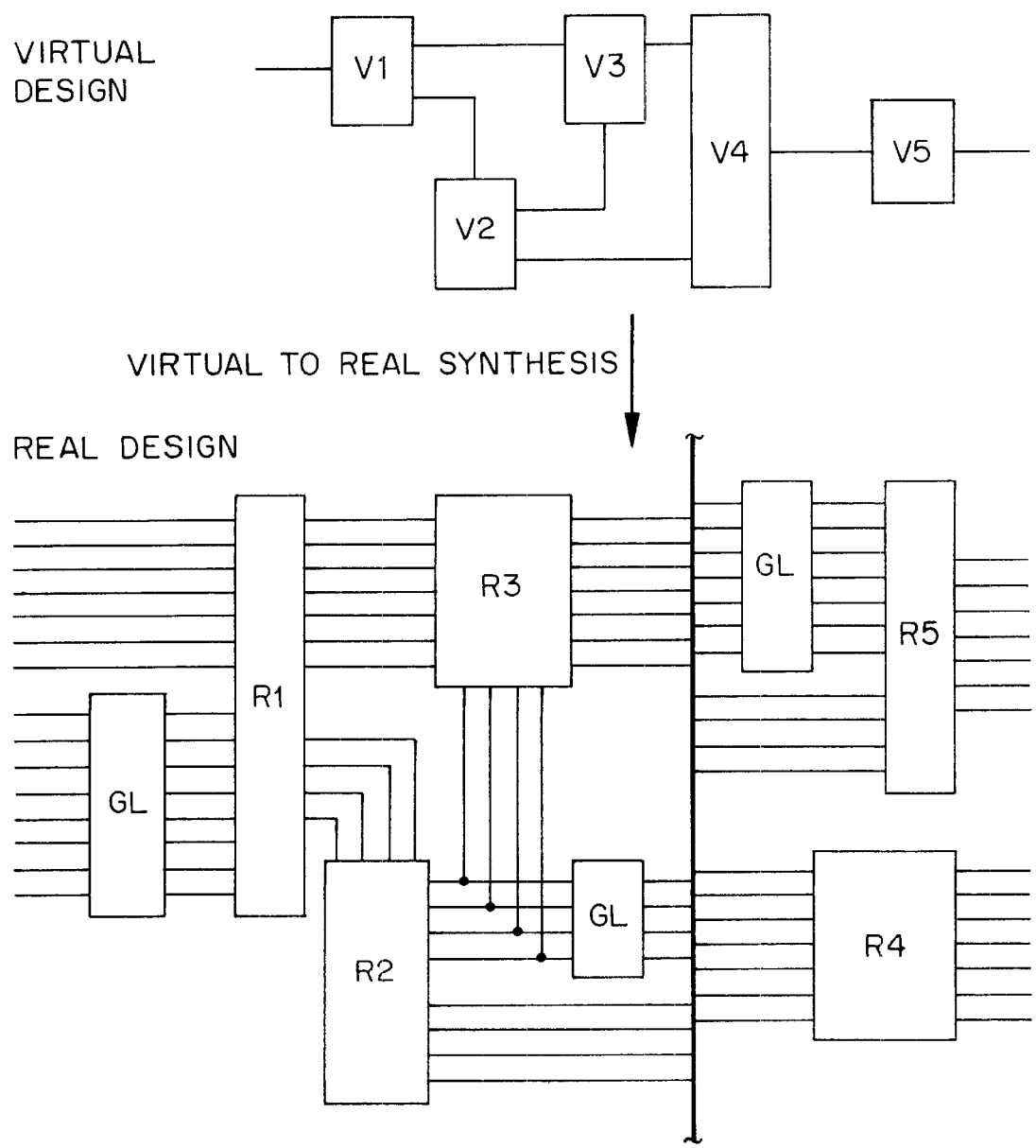
FIG. 4 is a schematic illustration of virtual to real synthesis.

Preferably, a virtual-to-real synthesis engine (VRSE) realized in accordance with at least one embodiment of the present invention, is responsible for synthesizing a real design from a virtual design. Reference is made in this connection to FIG. 4. The expansion of virtual interfaces and virtual nets into real interfaces and real nets preferably relies on "properties" attached to both virtual and real components and virtual and real pins. These properties preferably describe functional and structural characteristics of all components and their pins (both virtual and real). By comparing properties on two or more pins, it can be determined if the pins have the same functional and structural characteristics and therefore should be connected together.

The methods and algorithms describing these properties, as well as the techniques for comparing properties on pins and for automatically connecting pins with similar properties are documented in the patent application entitled "Methods and Arrangements for Automatically Interconnecting Cores In Systems-On-Chip," filed concurrently with this application as IBM Case No. YOR9-2000-0054 and with Reinaldo Bergamaschi and Subhrajit Battacharya as the inventors. The VRSE preferably makes use of the methods disclosed therein and expands them with the concept of virtual and real designs.

Preferably, the VRSE is comprised of the following steps:
1. Starting from a virtual design, the VRSE visits all its virtual components. For each virtual component, the VRSE instantiates a real component in the real design. The exact real component used is either a default one, or selectable by the designer based on a given virtual component library (see FIG. 1) which lists all available real components for a given virtual component.
2. The VRSE traverses every virtual net (in the virtual design) and the virtual pins connected to it. For each virtual pin visited, it determines the corresponding real pins that have compatible functionality. This is accomplished by using the Core Interconnection Engine (CIE) described in Bergamaschi et al., supra, for comparing properties between virtual pins and real pins in corresponding virtual and real components. This is illustrated in the first comparison step shown in FIG. 5. Given a virtual pin v1 in virtual component VC1, the VRSE uses the CIE to compare the properties (see Bergamaschi et al., supra, for a full description of core and pin properties) of V1 with those of all real pins in real component RC1. From this comparison it can establish that real pins r1, r2 and r3 are compatible with virtual pin v1. Similarly, it can derive that, for example, real pins r6, r7 and r8 in real component RC2 are compatible with virtual pin v3 in virtual component VC2.

3. Given two groups of real pins in two real components (corresponding to two virtual pins connected by a virtual net), the VRSE uses the Core Interconnection Engine (see Bergamaschi et al., supra) again to compare the properties on the real pins (across these two groups) and determine which real pins should be connected together. This is the second comparison step shown in FIG. 5. Assuming that real pins {r1, r7}, {r2, r8} and {r3, r6} are compatible, the VRSE generates real nets connecting pins r1 to r7, r2 to r8, and r3 to r6. The VRSE automatically determines the direction of the real ports (in, out, inout) and connects them correctly.

Figure 6:
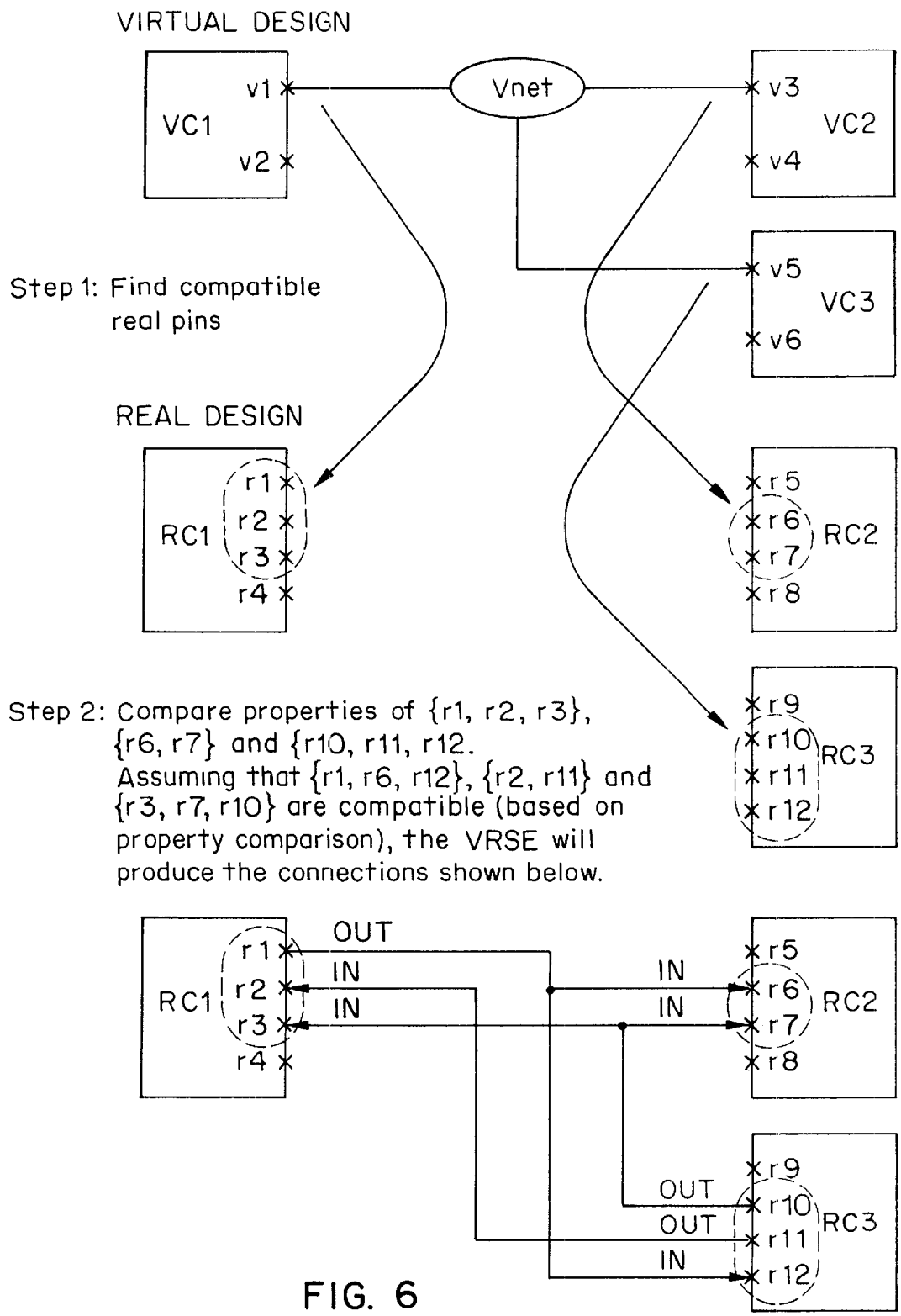
FIG. 6 is a schematic illustration of virtual to real synthesis with a multi-point virtual net.

FIG. 5 shows simple cases of straight connections, however, the algorithm supports the specification of simple logic functions associated with real pins, and when the connection is made those logic functions are created as well. This is used for automatically inserting any required glue logic between components. FIG. 6 shows a more complex example of a virtual to real synthesis process. In this case there is a virtual net connected to three virtual ports in different virtual components. The virtual ports get expanded into real ports which may be inputs or outputs. The VRSE uses the Core Interconnection Engine (see Bergamaschi et al., supra) to determine the real ports corresponding to each virtual port. Then by comparing properties on the real ports, it determines which real ports should be connected together. In this example, it found 3 sets of ports with compatible properties (thus should be connected together): {r1, r6, r12}, {r2, r1} and {r3, r7, r10}. The VRSE checks whether the ports are drivers or receivers (outputs, inputs, or bidis) and connects them appropriately.

Preferably, a VRSE formed in accordance with at least one embodiment of the present invention will also be capable of automatically creating a logic network for interconnecting components. This capability is not aimed at creating full interface logic between components (such as the automatic synthesis of protocols), but primarily targeted at creating simple glue logic which can be described as a simple Boolean expression. Some examples of this capability are described below.

1. Resolving multiple drivers: if two real ports which are deemed compatible are drivers, there may be a contention problem (for example, two outputs and one input being connected together), which is resolved based on a special property called CONNECTION_LOGIC attached to the input port (real port). This property is used for specifying a simple Boolean expression that takes as sources all the drivers and whose sink is connected to the input port. The VRSE creates the gates required for implementing this Boolean expression in the real design and connects the sources and sinks appropriately.

2. Grouping of bits into a bundle: sometimes it is necessary to group multiple source nets and connect all of them (as a bundle) to a sink pin of larger size (number of bits). This situation is implemented by the VRSE in a similar manner to case 1 of multiple drivers. If the sink pin has property CONNECTION_LOGIC with value "CONCAT", then the VRSE groups all source nets into a bundle and connects the whole bundle to the sink pin. Checks are made to ensure that the size of the bundle matches the size of the sink pin, otherwise padding or truncation may occur. The user or operator is notified whenever the sizes mismatch.

3. Ordering bits in a bundle according to priority: in certain types of connections (e.g., interrupt pins) it is necessary to order the bits in a bundle according to their priority. For example, the interrupt controller core (real component) has a multi-bit input for the interrupt requests. All single-bit interrupt request pins from the cores get bundled in a multi-bit net which is then connected to the interrupt request in the interrupt controller. Moreover, each single-bit interrupt request has an interrupt priority and it must be added to the bundle in the bit-position corresponding to its priority. This case is implemented by the VRSE as follows: it first groups all single-bit interrupt request pins into a bundle (as in case 3), and then it reorders the bits in the bundle according to their relative priorities. The priorities should be non-overlapping; it two interrupt requests have the same priority, they are positioned one after the other.

4. Connecting different bit-widths: whenever two real ports are connected together, the VRSE checks if their bit-widths are the same. If they are different, it may be necessary to truncate or pad the source net in order for its width to match the sink port. If the sink width is smaller than the source width, truncation takes place, which can be on the most-significant or least significant side. If the sink width is larger than the source width then padding takes place, which can be done in many ways, e.g., with zeros, ones, sign-extend (replicating the sign bit).

FIG. 7 presents examples of the above four cases. In this case, the virtual design contains four virtual components and two virtual nets connected to all four virtual components. Each virtual pin gets expanded into one or two real pins. FIG. 7 shows the virtual to real interface mappings as well as the sizes and direction of all real pins. For example, virtual pin v1 in VC1 gets expanded into real pins r1 and r2 in real component RC1. Pin r1 is an output and contains 1 bit (with bounds 0 to 0), whereas pin r2 is an input of 16 bits (bounds 0 to 15). FIG. 7 shows also the compatible sets of real pins which should be connected together. Using the properties attached to each virtual and real pin, the Core Interconnection Engine (see Bergamaschi et al., supra; used by the VRSE) determined for example, that pins {r1, r5, r10, r13} should be connected together.

When connecting pins together, the VRSE checks if they are drivers or receivers and their properties as explained earlier in this section. For example, the compatible set {r1, r5, r10, r13} has 3 output pins (r1, r10 r13) and 1 input pin (r5), hence this is a situation of multiple drivers. Pin r5 has property CONNECTION_LOGIC=XOR, which specifies the Boolean expression that must be built to implement the interface to pin r5. The VRSE creates an XOR gate and connects all driver (output) pins in the compatible set to this XOR gate, and connects its output to the receiver pin r5. There may be more than 1 receiver pin in each compatible set.

In the case of compatible set {r2, r6, r9, r12}, there is 1 receiver pin r2 of 16 bits and 3 driver pins r6, r9 and r12 of sizes 4, 7 and 5 bits respectively. Since pin r2 has property CONNECTION_LOGIC=CONCAT, the 3 driver pins are concatenated into a 16-bit bundle which is then connected to r2. The bundling of these 3 pins is done without to their relative order. Similarly, compatible set {r4, r8, r1 1, r14} also has 3 drivers and 1 receiver (r11) with property CONNECTION_LOGIC=CONCAT, however, the driver pins r4, r8 and r14 have property PRIORITY equals 2, 0 and 1 respectively. Hence the VRSE when creating the bundle of r4, r8 and r14 into a 3-bit bundle, it orders the bits in the bundle according to their relative PRIORITY, i.e., pin r8 is connected to bit 0, pin r14 to bit 1 and pin r4 to bit 2.

Compatible set {r3, r7} illustrates the case where two pins of different sizes need to be connected, therefore requiring a size adjustment. In this case the driver pin r3 which has 16 bits (with bounds 0 to 15) is being connected to the receiver pin r7 which has 8 bits (bounds 0 to 7). The VRSE truncates the net connected to r3 to 8 bits and connects only those 8 bits to r7. The truncation can happen on the most- significant or least-significant side. In this case, the 8 most significant bits of r4 (bits 0 to 7) were truncated and the remaining bits (bits 8 to 15) were connected to pin r7.

Any Soc will contain several connections which are generic, i.e., when a net needs to be connected to a large number of pins. This is the case, for example, for clock and test nets which usually go to almost all cores in a design. In order to make it easier for the designer to implement these connections, the VRSE preferably has a special capability that may be referred to as "broadcast connection". Using this capability, it is not necessary to in the virtual design those virtual interfaces which usually should be connected to most cores. In other words, the designer does not need to worry about connecting the virtual clock, test and other generic interfaces even in the virtual design.

The broadcast connection capability preferably takes place after the VRSE creates the real design from the virtual design. It searches for all unconnected real pins in the real components in the real design, and selects all those that have property BROADCAST_CONNECTION=TRUE. It then applies the Core Interconnection Engine (see Bergamaschi et al., supra) only to those selected real pins to generate possible compatible sets, and then it connects the real pins in each compatible set together. This scheme is prefeably used primarily for clocks and test pins, and it can handle even complex clocking schemes, such as multiple clock frequencies.

In practice, the methods and algorithms presented herein have been implemented in C++ and tested using the IBM BLue Logic™ Core Library and the CoreConnect™ bus architecture. A virtual component library and all virtual components for the IBM Blue Logic™ Core Library have been defined and tested. Several virtual designs have been created and automatically synthesized to real designs. Significant reductions in design size and time have been accomplished. For example, a reference SoC design composed of 41 instantiated cores and macros was reduced from 6900 lines of Verilog for the real design to around 600 lines for virtual design.

Figure 8:
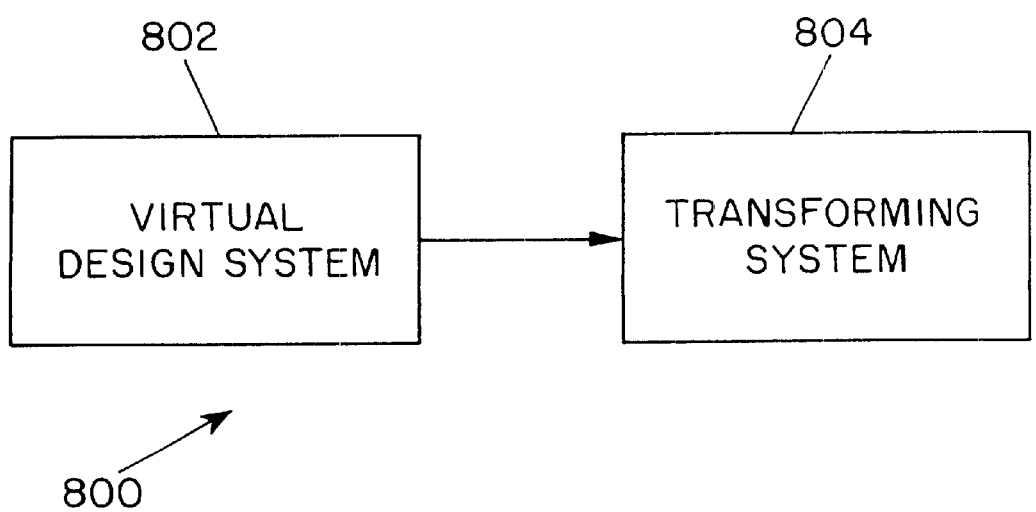
FIG. 8 is a schematic block diagram of a virtual-to-real synthesis system as broadly contemplated.

FIG. 8 illustrates a schematic block diagram of an virtual-to-real synthesis system 800 as broadly contemplated in accordance with at least one presently preferred embodiment of the present invention. As shown, the system 800 may preferably include a virtual design system 802 and a transforming system 804. Virtual design system 802 preferably establishes a virtual design for a system-on-chip, the virtual design including at least two virtual components, at least one virtual pin associated with each virtual component, and at least one virtual interconnection between at least one pair of virtual pins. The transforming system 804, on the other hand, preferably automatically transforms the virtual design into a real design, the real design including at least two real components, at least one real pin associated with each real component and at least one real interconnection between at least one pair of real pins. Preferably, the transforming system 804 is adapted to determine the at least one real interconnection based on the compatibility between different real pins.

In brief recapitulation, the instant disclosure presents several novel approaches for designing SoCs. Among the chief innovations are: (1) a method for specifying a high-level abstraction of a real component, called virtual component; (2) a method for specifying a complete system-on-chip at a very high-level of abstraction which is also automatically synthesizable—this specification is referred to as a "virtual design" and includes virtual components, virtual ports and virtual nets; (3) a method for describing such a virtual design using either a schematic diagram or hardware description languages such as VHDL or Verilog; (4) a method for organizing virtual and real components into a virtual component library, which can be used by the designer as well as automatically by the program implementation; and (5) a method for automatically synthesizing the virtual design to a real design consisting of real components, ports, nets and interface logic.

It is believed that the methods and algorithms presented herein represent one of the first approaches that can describe SoCs at a very high-level of abstraction and automatically synthesize it. It achieves this by using a unique encapsulation of the structural and functional information of the cores in virtual representations with properties, called the virtual design. It then expands the virtual components, virtual ports and virtual nets into real components, ports, nets and interface logic, thus generating a top level real design corresponding to the virtual design.

It is to be understood that the present invention, in accordance with at least one presently preferred embodiment, includes a virtual design system for establishing a virtual design for said system-on-chip, and a transforming system for automatically transforming the virtual design into a real design. Together, the virtual design system and transforming system may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method of predetermining interconnections between at least two cores in a system-on-chip, said method comprising the steps of:

establishing a virtual design for said system-on-chip, the virtual design including at least two virtual components, at least one virtual pin associated with each virtual component, and at least one virtual interconnection between at least one pair of virtual pins; and automatically transforming the virtual design into a real design, the real design including at least two real components, at least one real pin associated with each real component and at least one real interconnection between at least one pair of real pins;

wherein said transforming step comprises determining the at least one real interconnection based on the compatibility between different real pins.

2. The method according to claim 1, further comprising, prior to said step of determining the at least one real interconnection:

determining at least one corresponding real component for each virtual component; and determining at least one corresponding real pin for each virtual pin; and determining the compatibility between at least two real pins whose corresponding virtual pins share at least one common virtual interconnection.

3. The method according to claim 2, wherein said step of determining at least one corresponding real component comprises at least one of the following (A) and (B):

(A) determining at least one corresponding real component by default; and (B) determining at least one corresponding real component via accessing a virtual component library that specifies at least one available real component corresponding to at least one virtual component.

4. The method according to claim 1, wherein said step of determining the at least one real interconnection based on the compatibility between different real pins comprises comparing properties associated with each of said real pins.

5. The method according to claim 1, wherein said transforming step comprises specifying said real pins based on the compatibility between at least one virtual pin in a virtual component and at least one real pin in a corresponding real component.

6. The method according to claim 1, wherein said transforming step comprises:

automatically determining the direction of at least one real pin belonging to a real component; and automatically determining the required interconnection logic for interconnecting at least two real pins.

7. A system for predetermining interconnections between at least two cores in a system-on-chip, said system comprising:

a virtual design system which establishes a virtual design for said system-on-chip, the virtual design including at least two virtual components, at least one virtual pin associated with each virtual component, and at least one virtual interconnection between at least one pair of virtual pins; and a transforming system which automatically transforms the virtual design into a real design, the real design including at least two real components, at least one real pin associated with each real component and at least one real interconnection between at least one pair of real pins;

wherein said transforming system is adapted to determine the at least one real interconnection based on the compatibility between different real pins.

8. The system according to claim 7, wherein said transforming system is further adapted to perform the following steps prior to determining the at least one real interconnection:

determining at least one corresponding real component for each virtual component; and determining at least one corresponding real pin for each virtual pin; and determining the compatibility between at least two real pins whose corresponding virtual pins share at least one common virtual interconnection.

9. The system according to claim 8, wherein said transforming system is further adapted to determine at least one corresponding real component via at least one of the following steps (A) and (B):

(A) determining at least one corresponding real component by default; and (B) determining at least one corresponding real component via accessing a virtual component library that specifies at least one available real component corresponding to at least one virtual component.

10. The system according to claim 7, wherein said transforming system is adapted to determine the at least one real interconnection by assessing the compatibility between different real pins via comparing properties associated with each of said real pins.

11. The system according to claim 7, wherein said transforming system is further adapted to specify said real pins based on the compatibility between at least one virtual pin in a virtual component and at least one real pin in a corresponding real component.

12. The system according to claim 7, wherein said transforming system is further adapted to perform the following steps prior to creating a real interconnection between at least two real pins:

automatically determine the direction of at least one real pin belonging to a real component; and automatically determine the required interconnection logic for interconnecting at least two real pins.

13. A program storage device readable by machine, tangibly embodying a program of instructions executable by the machine to perform method steps for predetermining interconnections between at least two cores in a system-on-chip, said method comprising:

establishing a virtual design for said system-on-chip, the virtual design including at least two virtual components, at least one virtual pin associated with each virtual component, and at least one virtual interconnection between at least one pair of virtual pins; and automatically transforming the virtual design into a real design, the real design including at least two real components, at least one real pin associated with each real component and at least one real interconnection between at least one pair of real pins;

wherein said transforming step comprises determining the at least one real interconnection based on the compatibility between different real pins.

* * * * *

UNITED STATES PATENT AND TRADEMARK OFFICE
CERTIFICATE OF CORRECTION

PATENT NO. : 6,477,691 B1
DATED : November 5, 2002
INVENTOR(S) : Reinald A. Bergamaschi et al.

It is certified that error appears in the above-identified patent and that said Letters Patent is hereby corrected as shown below:

<u>Title page,</u>
Item [12], should read -- Bergamaschi, et al. --
Item [75], inventor "Reinaldo A. Bergamashi/Rab" should read -- Reinaldo A. Bergamaschi --.

Signed and Sealed this

Fifteenth Day of July, 2003

JAMES E. ROGAN
*Director of the United States Patent and Trademark Office*